United States Patent [19]
Arai

[11] 3,986,077
[45] Oct. 12, 1976

[54] VERTICAL DEFLECTION CIRCUIT

[75] Inventor: Takeshi Arai, Osaka, Japan

[73] Assignee: Sanyo Electric Co., Ltd., Japan

[22] Filed: Nov. 22, 1974

[21] Appl. No.: 526,385

[30] Foreign Application Priority Data
Nov. 24, 1973 Japan............................. 48-132303

[52] U.S. Cl................................. 315/389; 315/393
[51] Int. Cl.² .................... H01J 29/70; H01J 29/72
[58] Field of Search ........... 315/389, 407, 408, 409, 315/370 LC, 393

[56] References Cited
UNITED STATES PATENTS

| | | | |
|---|---|---|---|
| 3,381,165 | 4/1968 | Taylor.................................. | 315/408 |
| 3,488,553 | 1/1970 | McDonald et al.................. | 315/389 |
| 3,678,331 | 7/1972 | Fischman............................ | 315/389 |

*Primary Examiner*—Maynard R. Wilbur
*Assistant Examiner*—T. M. Blum
*Attorney, Agent, or Firm*—Armstrong, Nikaido & Wegner

[57] ABSTRACT

In a vertical deflection circuit for use in a television receiver or the like comprising a vertical oscillation circuit, a saw-tooth wave voltage generating circuit connected to the vertical oscillation circuit and a vertical deflection output circuit to which the output from the sawtooth wave voltage generating circuit is supplied, a capacitance circuit or a clamp circuit is advantageously incorporated in the vertical deflection circuit in order to eliminate bad effects on the interlaced scanning arising from the linearity correction loop.

10 Claims, 22 Drawing Figures

(a)

(b)

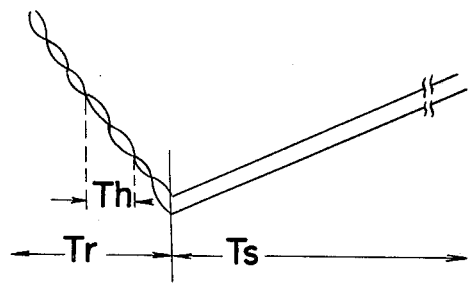
FIG. 3 (prior art)
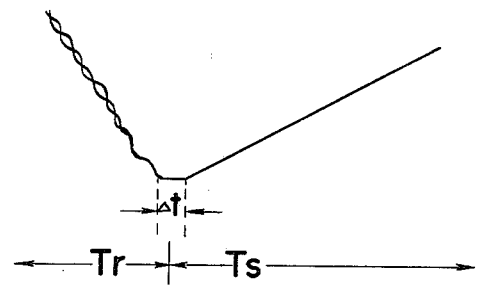
FIG. 5
FIG. 6
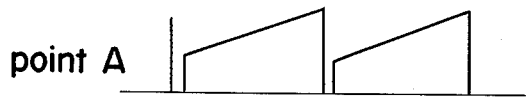
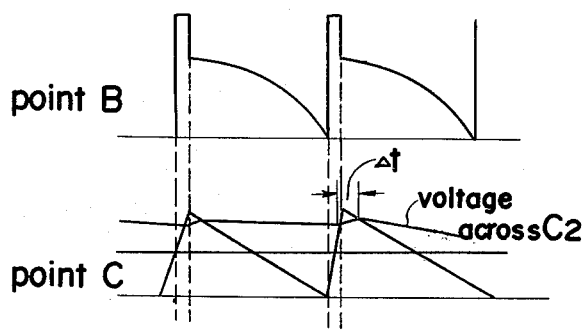
FIG. 8
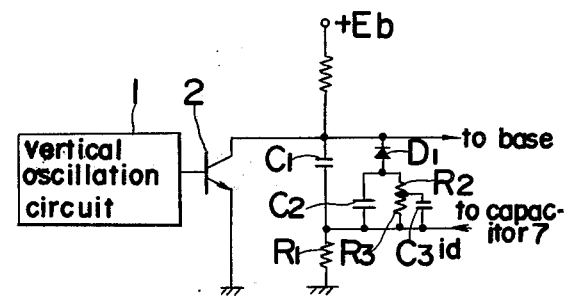
FIG. 7
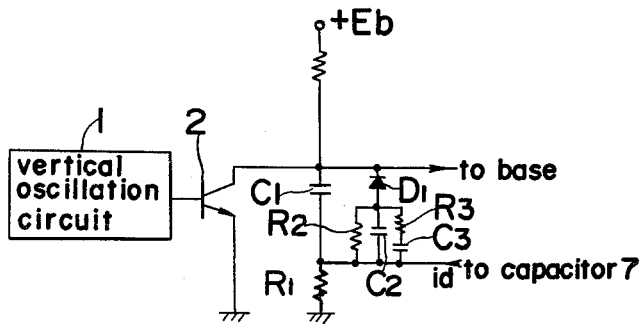
FIG. 9
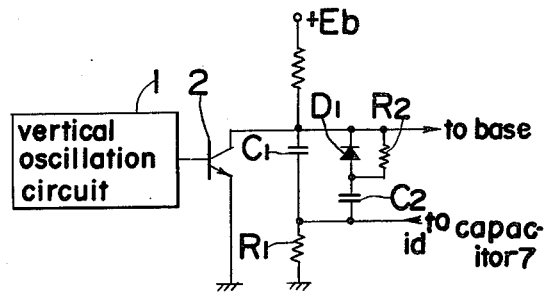

VERTICAL DEFLECTION CIRCUIT

The present invention relates to a vertical deflection circuit for use in a television receiver or the like and, more particularly, to a transistorized vertical deflection circuit of a type wherein no vertical output transformer is employed. This type of vertical deflection circuit with no output transformer is generally referred to as an OTL (Output Transformerless) type vertical deflection circuit.

Conventionally, in the known vertical deflection circuit for use in television receivers or the like, various feedbacks are effected to attain good linearity. For example, feedback is effected from a vertical deflection output circuit to a saw-tooth wave voltage generating circuit provided at the stage prior to said vertical deflection output circuit, in which case, when observation is made on the retracing period, a switching transistor for the saw-tooth voltage generating circuit becomes conductive, and horizontal signals from a horizontal deflection circuit and a pincushion correction circuit are in a state liable to be impressed upon the saw-tooth voltage generating circuit through the feedback loop with the vertical scanning being in a different phase relation to the horizontal scanning for each one field. Accordingly, upon completion of the vertical retracing period, voltage across a charge-and-discharge capacitor for the formation of the saw-tooth wave voltage in the saw-tooth wave voltage generating circuit has d.c. level different for each one field, resulting in improper vertical interlaced scanning.

For the purpose of clearly explaining the disadvantages inherent in the conventional vertical deflection circuit of the above described type, the proir art circuit will be described with reference to FIGS. 1 through to 3.

FIG. 3 is a diagram showing the variations of the terminal voltage of a charge-and-dischrge capacitor in the prior art deflection circuit.

Figure 1:
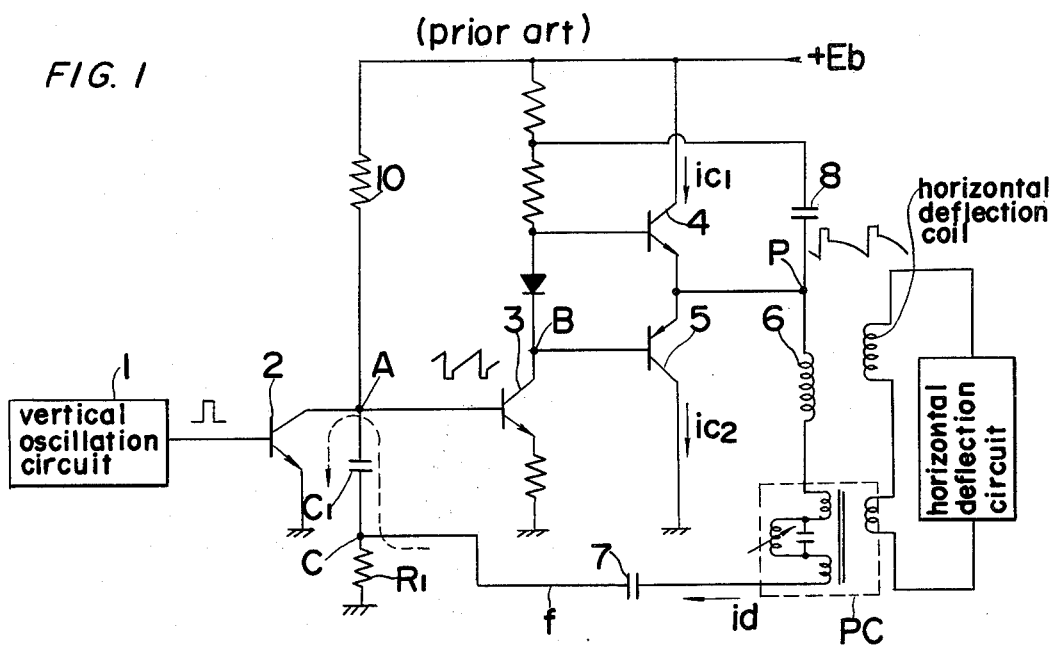
FIG. 1 is a circuit diagram showing the proir art vertical deflection circuit.
Figure 2:
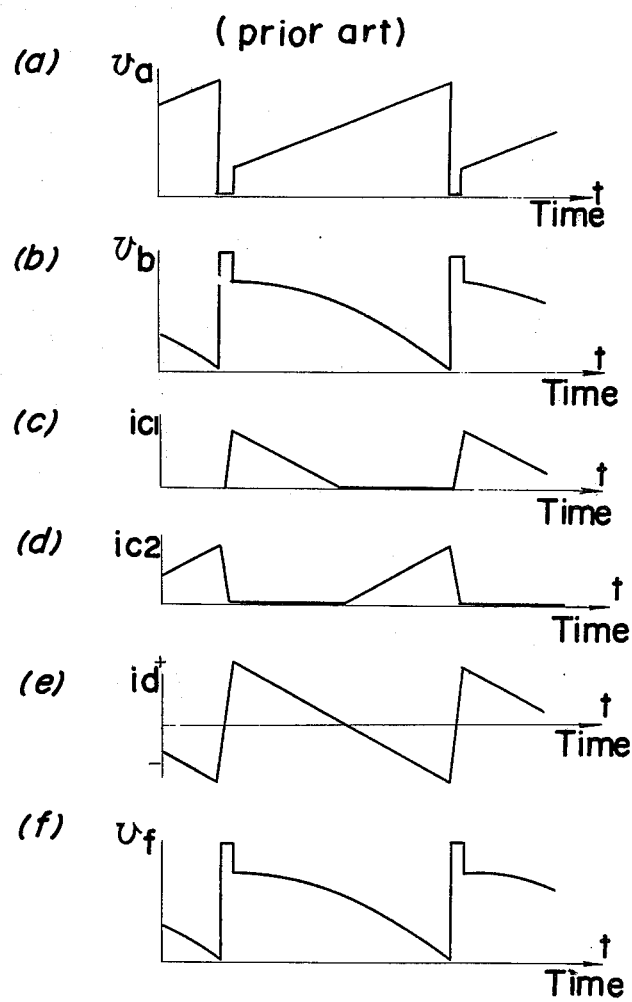
FIGS. 2a to 2f are diagrams showing the wave forms of vertical deflection output produced in the prior art vertical deflection circuit of FIG. 1.

Referring to FIG. 1, the circuit arrangement is such that, since a switching transistor 2 for saw-tooth wave voltage generation whose base is connected to a vertical oscillation circuit 1 is non-conductive in the scanning period, a charge-and-discharge capacitor C1 for forming the saw-tooth wave voltage is gradually charged by a power source +Eb through a resistor 10, while, in the retracing period, as the switching transistor 2 becomes conductive, the charge imparted to the capacitor C1 is discharged through said capacitor C1 with the saw-tooth voltage obtained across the capacitor C1, which sawtooth voltage is subsequently amplified by a driving tansistor 3 and simultaneously inverted to be applied to the bases of the output transistors 4 and 5. More specifically, when the saw-tooth wave voltage $Va$ (at point A in FIG. 1) as shown in FIG. 2a is applied to the base of the driving transistor 3, an amplified and phase-inverted exciting voltage $Vb$ (at point B in FIG. 1) as shown in FIG. 2b appears at the collector of the driving transistor 3 and applied to the bases of the output transistors 4 and 5, so that the output transistor 4 is rendered conductive at the first half of the scanning with a collector current $ic1$ as shown in FIG. 2c flowing in the collector of the transistor 4, while the output transistor 5 becomes conductive at the latter half of the scanning with a collector current $ic2$ as shown in FIG. 2d flowing in the collector of the transistor 5. Consequently, a deflection current $id$ as shown in FIG. 2e flows in a vertical deflection coil 6 with voltage $Vf$ as shown in FIG. 2f appearing at a junction P of the emitters of the output transistors 4 and 5.

Accordingly, the feedback loop $f$ including a capacitor 7 and a resistor R1 functions so as to maintain the base potential of the driving transistor 3 alternatingly constant.

When observation is made on the retracing period, the switching transistor 2 is rendered conductive with a current flowing through the charge-and-discharge capacitor C1 in a path shown by a dotted line arrow in FIG. 1, and upon completion of the retracing period, the terminal voltage across the capacitor C1 reaches a certain value.

Since the vertical scanning is in a different phase relation to the horizontal scanning for each one field, there are cases where the terminal voltage across the charge-and-discharge capacitor C1 has different values for each one field due to the influence of voltages induced in the feedback loop $f$ through a pincushion distortion correction circuit PC and a deflection coil 6, in which case the terminal voltage across the charge-and-discharge capacitor C1 differs in the d.c. level for each one field, resulting in the fluctuation of the d.c. level of the vertical deflection output current and thus deteriorating the interlaced scanning. In other words, the variations of the terminal voltage of the charge-and-discharge capacitor C1 are as shown in FIG. 3 with consequent inferior interlaced scanning, in which FIG. 3 the scanning period is shown by the symbol $Ts$, the retracing period by the symbol $Tr$ and the horizontal scanning period by the symbol $Th$.

Accordingly, an essential object of the present invention is to provide a vertical deflection circuit for use in a television receiver or the like in which ill effects of a linearity control feedback loop hindering a proper interlaced scanning are advantageously removed with substantial elimination of the disadvantages inherent in the conventional vertical deflection circuits.

Another important object of the present invention is to provide a vertical deflection circuit of the above described type in which a capacitance circuit is incorporated for substantially increasing the capacity value of a charge-and-discharge capacitor for a predetermined period of time including a retracing period completion time in order to achieve proper and stable interlaced scanning.

A further object of the present invention is to provide a vertical deflection circuit of the above described type in which a clamping circuit comprising a switching element and a constant voltage compensator for supplying a constant voltage to a capacitor for saw-tooth signal formation is provided for improved interlaced scanning.

A still further object of the present invention is to provide a vertical deflection circuit of the above described type which is simple in construction and accurate in functioning with consequent low cost.

According to a preferred embodiment of the present invention, a capacitance circuit is advantageously incorporated in the vertical deflection circuit of FIG. 1, which capacitance circuit further comprises a switching diode connected in series with a resistor and an auxiliary capacitor which are in parallel connection to each other. The capacitor circuit is connected in parallel to the charge-and-discharge capacitor which is connected between the collector of the switching transistor and the feedback loop in the vertical deflection circuit of FIG. 1. The auxiliary capacitor is one having a large capacity as compared with the charge-and-discharge capacitor, while the resistor which is in parallel connection to the auxiliary capacitor is such one as will form, together with the auxiliary capacitor, a large time constant circuit as compared with the vertical deflection period, by which circuit construction the ill effects from the linearity control feedback loop obstructing the proper interlaced scanning are advantageously eliminated.

Figure 4:
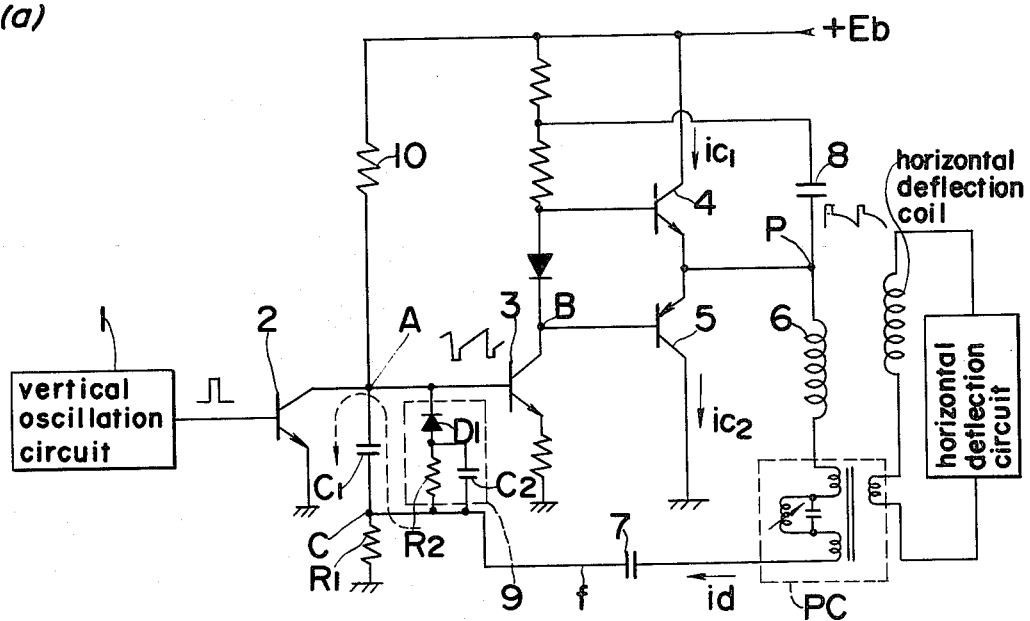
Figure 4:
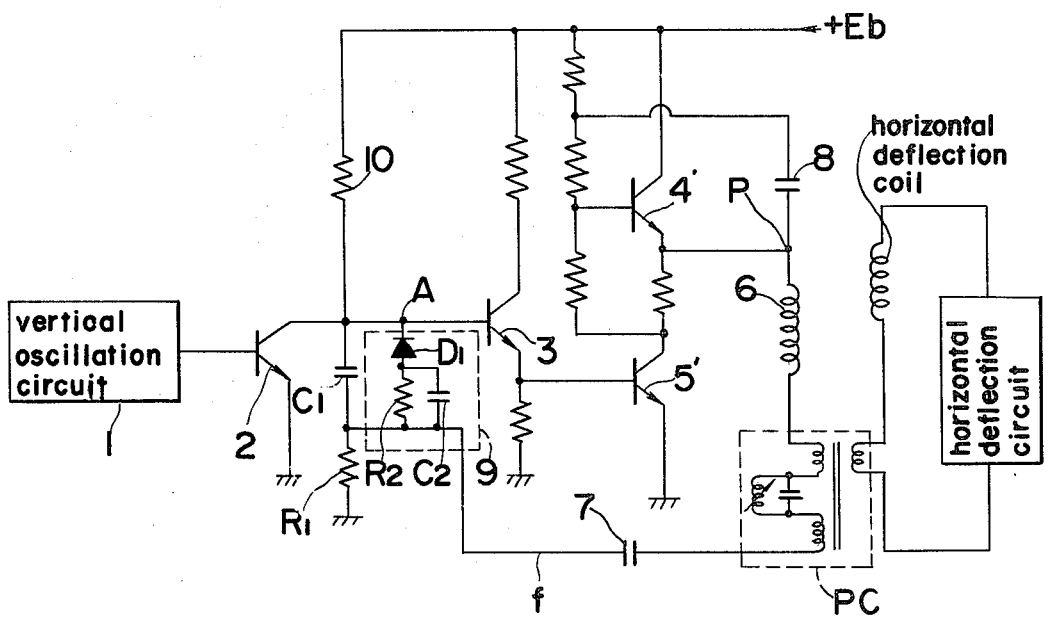

These and other objects and features of the present invention will become apparent from the following description taken in conjunction with preferred embodiments thereof with reference to the accompanying drawings, in which;

FIG. 4a is a circuit diagram showing one embodiment of a vertical deflection circuit according to the present invention, FIG. 4b is a similar diagram to FIG. 4a, but vertical deflection output transistors of the same polarity are employed therein, FIGS. 5 and 6 are diagrams explanatory of the modes of operations of the circuit shown in FIG. 4a, FIGS. 7 to 9 are circuit diagrams showing modifications of the circuit of FIG. 4a.

Figure 10:
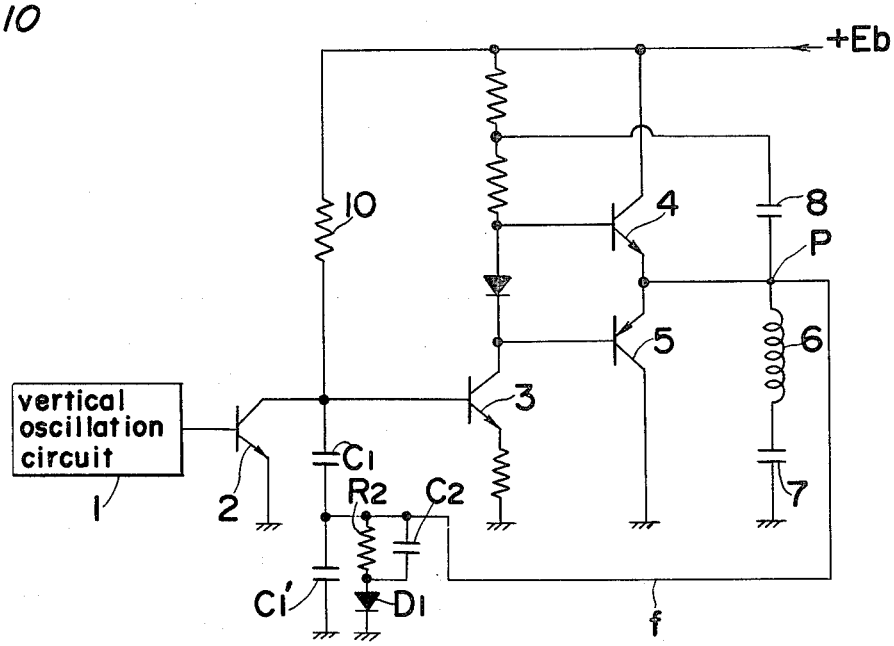
Figure 11:
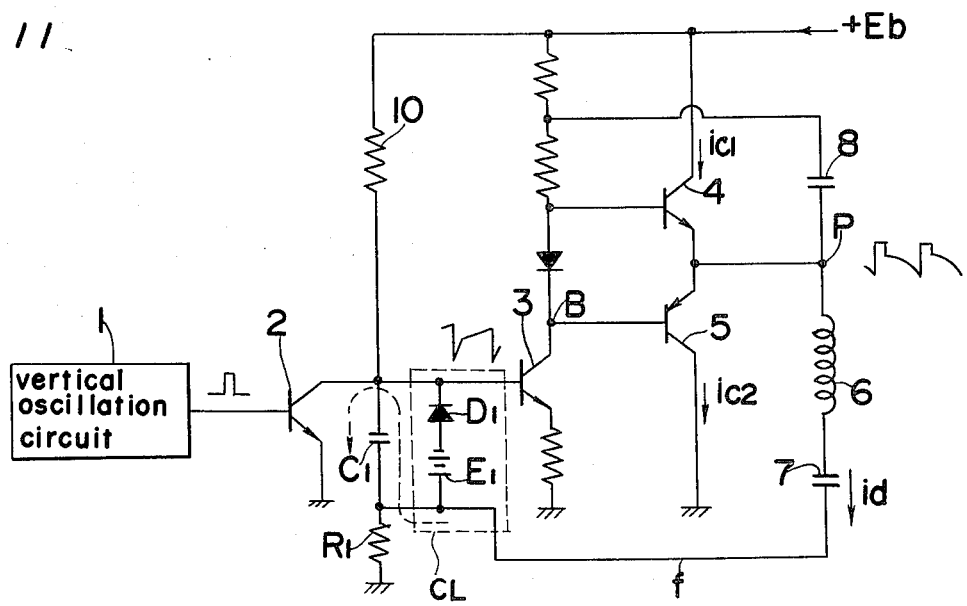
Figure 12:
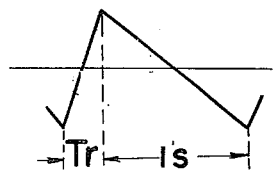
Figure 13:
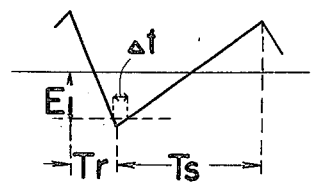
Figure 14:
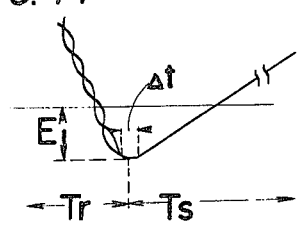
Figure 15:
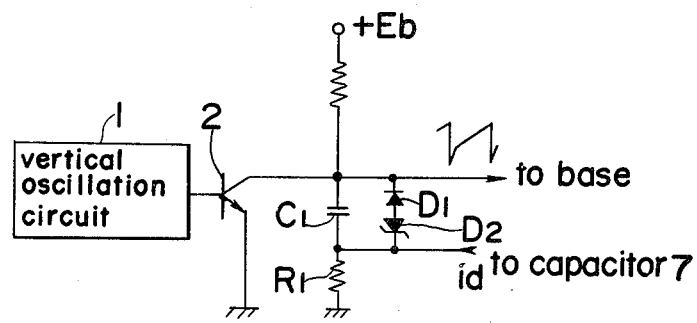
Figure 16:
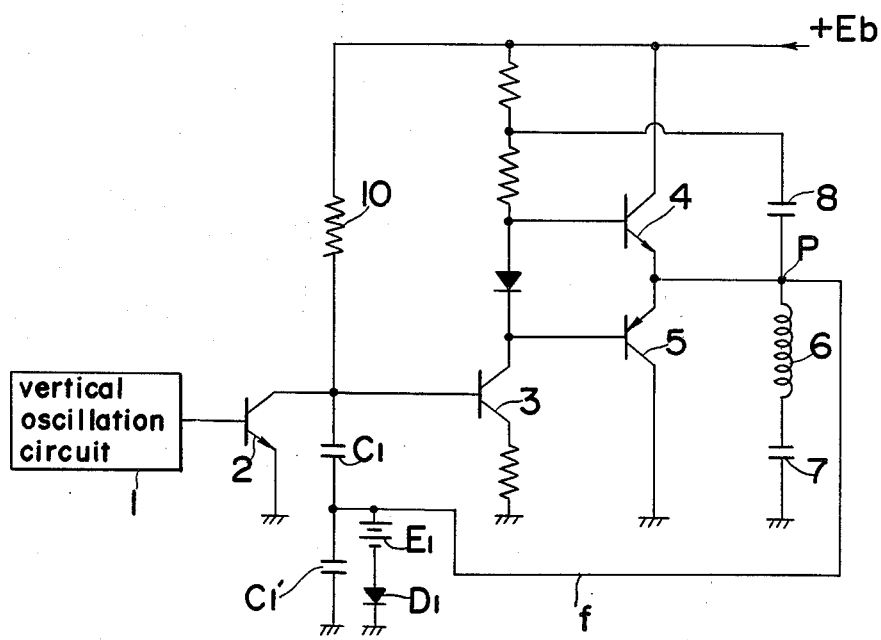

FIG. 10 is a circuit diagram showing a second embodiment of a vertical deflection circuit according to the present invention, FIG. 11 is a circuit diagram showing a third embodiment of a vertical deflection circuit according to the present invention, FIGS. 12 to 14 are diagrams explanatory of the modes of operations of the circuit in FIG. 11, FIG. 15 is a circuit diagram showing a modification of the circuit of FIG. 11 and FIG. 16 is a circuit diagram showing a fourth embodiment of a vertical deflection circuit according to the present invention.

Before the description of the present invention proceeds, it should be noted that like parts are designated by like reference numerals throughout the several views of the accompanying drawings.

Referring now to FIG. 4a, the vertical deflection circuit of the invention includes a vertical oscillation circuit 1 connected to the base of a switching transistor 2 for saw-tooth voltage generation, a charge-and-discharge capacitor C1 for saw-tooth wave voltage formation which is connected at one end thereof to the collector of the switching transistor 2 and to the base of a driving transistor 3 with the other end of the capacitor C1 connected to earth through a peaking resistor R1, two vertical deflection output transistors 4 and 5 of different polarity forming a vertical deflection circuit of a single ended push-pull (SEPP) type, a vertical deflection coil 6 to which a pincushion distortion correction circuit PC, a coupling capacitor 7 and a cancelling voltage supplying capacitor 8 are connected in series with the junction P of the capacitor 8 and the coil 6 connected to a common junction of the vertical deflection output transistors 4 and 5 and with the bases of the transistors 4 and 5 connected at a point B to the output collector of the driving transistor 3 for symmetrically exciting the transistors 4 and 5 by the driving voltage which is the output of the driving transistor 3, and a capacitance circuit 9 directly relevant to the present invention.

It should be noted that instead of the two vertical deflection output transistors 4 and 5 of different polarity to each other described as employed in the embodiment of FIG. 4a, two transistors 4' and 5' of the same polarity may be used with minor alteration in the circuit connection as shown in FIG. 4b, in which case also, the function of the circuit is approximately the same as in the embodiment of FIG. 4a, so that description thereof is abbreviated for brevity. Accordingly, although the description of modifications and other embodiments of the circuit is given hereinafter on the basis of FIG. 4a, it should be construed that these modifications and embodiments are also applicable to the circuit in FIG. 4b.

It should also be noted that, in the above circuit of FIGS. 4a or 4b if the vertical oscillation circuit 1 is formed by a multivibrator type oscillator or by a blocking oscillator, the transistors forming such oscillators may also serve the function of the switching transistor 2 mentioned above.

The above capacitance circuit 9 further includes a switching diode D1 connected in series with a resistor R2 and an auxiliary capacitor C2 which are in parallel connection. The capacitance circuit 9 is connected, between a point A and the feedback loop f of the vertical deflection circuit, in parallel to the charge-and-discharge capacitor C1 which is connected between the collector of the switching transistor 2 and the feedback loop f. The auxiliary capacitor C2 should be one having a large capacity as compared with the charge-and-discharge capacitor C1, while the resistor R2 should be one having a value as will form together with the auxiliary capacitor C2, a large time constant circuit as compared with the vertical deflection period.

In the normally operating condition of the vertical deflection circuit in the embodiment of FIG. 4a, a proper d.c. current appears across the auxiliary capacitor C2 by the time constant circuit comprising the capacitor C2 and the resistor R2 to which feedback current id is applied, and renders switching diode D1 conductive for a very short period of time including the retracing period completion time. In other words, the diode D1 becomes conductive for a very short period of time Δt in FIG. 5, and the circuit in FIG. 4a becomes equivalent to the circuit in which only the capacitor C2 and the resistor R2 are connected in parallel to the capacitor C1. Accordingly, the charge-and-discharge capacitor is substantially composed of the capacity of the above mentioned capacitors C1 and C2 in parallel connection with the capacity value thereof being (C1 + C2) and with the voltage resulting from the undesirable horizontal deflection current which flows into the charge-and-discharge capacitor from the vertical output circuit becoming sufficiently small by the large capacity of the capacitors C1 and C2, thus the ill effects due to the horizontal deflection circuit being remarkably reduced as in FIG. 5 as compared with the case in FIG. 3. In the period other than the above mentioned period Δt, the diode D1 is rendered non-conductive with the circuit in FIG. 4a becoming equivalent to a circuit in which the diode D1 of the capacitance circuit 9 is removed, and consequently with the auxiliary capacitor C2 being irrelevant to the capacitor C1, thus the charging and discharging being effected only by the capacitor C1.

Referring to FIG. 6, the function of the circuit during the very short period of time $\Delta t$ will be described more specifically hereinbelow. In the prior art circuit in FIG. 1 in which the diode D1, the capacitor C2 and the resistance R2 are not incorporated, voltages at points A and B, and voltage across the resistance R1 (point C) are as shown in FIG. 6. In the circuit of the invention in FIG. 4a having the capacitance circuit 9 comprising the diode D1, the capacitor C2 and the resistance R2, when the potential at the point A is low and the potential at the upper end of the resistance R1 is high, the diode D1 becomes conductive with the capacitor C2 charged, while in the other period, the capacitor C2 is discharged through the resistance R2. In other words, the terminal voltage across the capacitor C2 drops by the discharging amount through the resistance R2 after being charged and the capacitor C2 is subjected to subsequent charging. In the normal operating condition, the discharged amount is equal to the charged amount, so that if the discharging time constant due to the capacitor C2 and the resistance R2 is made sufficiently large as compared with the vertical deflection period, the discharging amount is equivalent to the charging amount during the vertical deflection period by the time constant, and the capacitor C2 is stablized at the charged condition of d.c. potential close to the maximum value of the saw-tooth wave voltage generated at the resistor R1 with the potential thereof slightly fluctuating by the charging and discharging mentioned earlier, which potential is in the direction to bias the diode D1 backward. In other words, in the stationary state, the diode D1 becomes conductive only when the sum of the potential generated at the resistance R1 and the potential at the capacitor C2 is of forward bias, while in the other period, the capacitor C2 is discharged through the resistance R2. If the discharging time constant of the resistance R2 and the capacitor C2 is sufficiently large, the time during which the diode D1 becomes conductive can be made very small as compared with the vertical deflection period.

When the circuit connection of FIG. 4a shown as the first embodiment of the present invention is employed, there are cases where vibrations of pictures are induced due to transient phenomenon during lock in time on synchronization, which undesirable vibrations, however, can be suppressed by the addition of proper phase correction circuits as shown in FIGS. 7 and 8. For such correction circuits, in FIG. 7, a resistor R3 and a third capacitor C3 in series connection are connected in parallel to the time constant circuit comprising the capacitor C2 and the resistor R2 of FIG. 4a.

Referring to FIG. 7, function of the phase correction circuit for preventing the vibrations of pictures due to the transient phenomenon will be more specifically described hereinbelow.

In the conventional vertical oscillation circuits, since the free oscillation frequencies thereof are set at low level as compared with the vertical deflection frequencies, the vertical deflection frequencies carry out deflection at frequencies lower than regular deflection frequences in the channel charge-over etc., so that the saw-tooth wave generating at the resistance R2 becomes larger than that in the normal deflection period with the capacitor C2 charged at high level, in which case, when the deflection frequencies return back to regular level, the capacitor C2 discharges through the resistance R2 and does not function satisfactorily until the potential thereof returns back to the normal level.

In order to overcome the above disadvantages in the prior art circuits, the capacitor C3 and the resistance R3 are added in the circuit of FIG. 7 of the invention with the capacitor C3 set to be of larger capacity than the capacitor C2 and with the resistance R3 set to be of smaller value than the resistance R2 so that the time constant of the circuit comprising the capacitor C2 and C3 and the resistance R3 is smaller than that of the capacitor C2 and the resistance R2, by which arrangement, the capacitor C2 is charged in the similar manner to the above through the diode D1 with the capacitor C3 charged rather slowly through the resistance R3 and the diode D1. Until the stationary state is reached, a discharging loop through the capacitors C2 and C3 and the resistance R3 is formed, but in the stationary state, the terminal voltages across the capacitors C2 and C3 are approximately equal to each other with the capacitor C2 discharged almost through the resistance R2 and with the capacitor C3 discharged through the resistances R2 and R3. When the capacitors C2 and C3 are steadily working at a normal frequency with the frequency being low for a short period of time and returning back to the normal frequency (low frequency only during the channel change-over period), the saw-tooth wave appearing at the resistance R2 becomes large for a short period of time as earlier mentioned, so that the capacitor C2 is rapidly charged through the diode D1, while the capacitor C3 is charged through the loop via the resistance R3 with consequent slow charging speed. Accordingly, the terminal voltage across the capacitor C3 memorizes the potential at the regular frequency, and when the low frequency returns back to the regular frequency, the charge stored in excess in the capacitor C2 is discharged through the resistance R2 and simultaneously through the resistance R3 and the capacitor C3 so as to rapidly reach the normal level.

In FIG. 8, the resistance R2 of the time constant circuit of FIG. 4a is divided in series into resistances R2 and R3 with a third capacitor C3 connected in parallel to the resistance R3. A similar phase correction circuit to one mentioned above can be connected as shown in FIG. 9, which is another modification of FIG. 4a.

Referring to FIG. 10 showing a second embodiment of the invention, the resistor R1 side of the capacitor 7 is earthed with the feedback loop f connected to point P in FIG. 4a to form a voltage feedback circuit, in which circuit the capacitor C'1 forms a part of the feedback loop $f$ from the vertical deflection output circuit to the saw-tooth wave voltage generating circuit, and also a part of the charge-and-discharge capacity for the formation of the saw-tooth wave voltage with the function thereof being similar to one in FIG. 4a.

Referring now to FIG. 11, there is shown a third embodiment of the invention. In this embodiment, a clamping circuit CL comprising a switching diode D1 and a constant voltage compensator E1 connected in series to each other is connected in parallel to the capacitor C1 for saw-tooth signal formation, which clamping circuit CL is intended to clamp the saw-tooth signal appearing across the capacitor C1 for a very short period of time including the completion time of the retracing period of the vertical deflection. In operation, the switching diode D1 is rendered conductive for the very short period of time including the completion time of the retracing period of the vertical deflection with the constant voltage compensator E1 supplying a constant voltage to the capacitor C1. In other words, the voltage across the charge-and-discharge capacitor C1 is adapted to be clamped at a constant value for a predetermined period of time including the retracing period completion time. In the above circuit arrangement, voltage as shown in FIG. 12 appears across the resistor R1 by the deflection current $i_d$ flowing through the feedback loop $f$. It is to be noted that if the switching diode D1 and the constant voltage compensator E1 are not incorporated, voltage as shown in FIG. 13 will appear across the capacitor C1. If the voltage of the constant voltage source is determined to be E1 as shown in FIG. 13, the switching diode D1 becomes conductive in the very small period of time $\Delta t$ exceeding the voltage E1, so that the voltage across the capcitor C1 is clamped at the voltage E1 for the very small period of time $\Delta t$ including the retracing period completion time, as shown in FIG. 14, thus the ill effects due to the horizontal deflection circuit are advantageously prevented.

Referring to FIG. 15, there is shown a modification of the embodiment in FIG. 11. In this modification, a Zenor diode Dz is employed instead of the constant voltage compensator E1 in FIG. 11, which Zenor diode Dz connected in series with the switching diode D1 is connected in parallel to the capacitor C1. In this modification, the Zenor diode Dz functions in the similar manner to the constant voltage compensator E1 of the embodiment of FIG. 11.

Referring now to FIG. 16 in which a fourth embodiment of the present invention is shown, a capacitor C'1 is connected in series to a capacitor C1 and in parallel to a constant voltage compensator E1 and a switching diode D1 which are connected in series to each other. In this embodiment, the capacitor C'1 forms a part of the feedback loop $f$ from the vertical deflection output circuit to the saw-tooth wave voltage generating circuit and simultaneously forms a part of the charge-and-discharge capacity for the formation of the saw-tooth wave voltage.

The function of the circuit in FIG. 16 is approximately the same as that of the circuit of FIG. 11, so that description thereof is abbreviated for brevity.

As is clear from the foregoing description, according to the vertical deflection circuit of the invention, the undesirable effects on the vertical interlaced scanning due to the horizontal deflectinon circuit is advantageously prevented through the linearity correction feedback loop, and perfect interlaced scanning can be accurately effected by the simple circuit construction and with the consequent low cost.

Although the present invention has been fully described by way of example with reference to the attached drawings, it is to be noted that various changes and modifications are apparent to those skilled in the art. Therefore, unless otherwise such changes and modifications depart from the scope of the present invention, whey should be construed as included therein.

What is claimed is:

1. A vertical deflection circuit in which a horizontal signal component synchronized with the horizontal synchronizing signal is applied to a vertical deflection output, said circuit comprising a vertical oscillation circuit for generating a vertical output pulse train in response to vertical synchronizing pulses applied thereto, a saw-tooth wave voltage generator which produces a series of saw-tooth signals in response to said vertical output pulses, a vertical output circuit for amplifying said saw-tooth signals and loading a vertical deflection coil, and a negative current feedback path for vertical linearity correction provided between said vertical output circuit and said saw-tooth wave voltage generator, said saw-tooth wave voltage generator including a switching circuit to be switched in response to said vertical output pulses from said vertical oscillation circuit, a first capacitor for the saw-tooth signal formation wherein said first capacitor is repeatedly charged or discharged in response to said switching circuit and wherein output signals from said vertical output circuit are applied through said negative current feedback path to said first capacitor, and a clamping circuit connected in parallel to said first capacitor for clamping the saw-tooth voltage formed by said first capacitor for a very short period of time including the completion time of the retracing period of said vertical deflection.

2. A vertical deflection circuit as claimed in claim 1, wherein said clamping circuit means comprises a switching element to be rendered conductive for said very short period of time including said completion time of the retracing period of said vertical deflection, and a second capacitor for stabilizing said saw-tooth signal which second capacitor is connected in parallel to all or part of said first capacitor when said switching element is rendered conductive.

3. A vertical deflection circuit as claimed in claim 2, wherein said clamping circuit means further includes a resistance which is connected in parallel to said second capacitor and which is adapted, together with said second capacitor, to set the conducting time of said switching element to said very short period of time including said completion time of the retracing period of said vertical deflection.

4. A vertical deflection circuit as claimed in cliam 3, wherein said clamping circuit means further includes a capacitor and a resistance in a series connection to each other and parallel to said second capacitor for preventing the vibration of a picture due to transient phenomenon.

5. A vertical deflection circuit as claimed in claim 2, wherein said clamping circuit means further includes a resistance which is connected in parallel to said switching element, and which is adapted, together with said second capacitor, to set the conducting time of said switching element to said very short period of time including said completion time of the retracing period of said vertical deflection.

6. A vertical deflection circuit as claimed in claim 2, wherein said clamping circuit means further includes a third capacitor connected in parallel to one of the divided resistors connected in parallel to said second capacitor for preventing vibration of picture due to transient phenomenon.

7. A vertical deflection circuit as claimed in claim 1, wherein said clamping circuit means comprises a switching element to be rendered conductive in said very short period of time including said completion time of the retracing period of said vertical deflection and a constant voltage compensator for supplying a constant voltage to said first capacitor when said switching element is rendered conductive.

8. A vertical deflection circuit as claimed in claim 7, wherein said constant voltage compensator for said clamping circuit means comprises a constant voltage source.

9. A vertical deflection circuit as claimed in claim 7, wherein said constant voltage compensator for said clamping circuit means comprises a Zenor diode.

10. A vertical deflection circuit as claimed in claim 7, wherein said switching element and said constant voltage compensator are connected in series to each other and in parallel to said first capacitor for the saw-tooth signal formation.

* * * * *